(12) United States Patent
Tsai et al.

(10) Patent No.: US 10,608,094 B2
(45) Date of Patent: Mar. 31, 2020

(54) SEMICONDUCTOR DEVICE AND METHOD OF FORMING THE SAME

(71) Applicant: Taiwan Semiconductor Manufacturing Co., Ltd., Hsinchu (TW)

(72) Inventors: Fu-Tsun Tsai, Tainan (TW); I-Chih Chen, Tainan (TW); Chih-Mu Huang, Tainan (TW); Jiun-Jie Huang, Kaohsiung (TW); Jen-Pan Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 76 days.

(21) Appl. No.: 15/877,395

(22) Filed: Jan. 23, 2018

(65) Prior Publication Data

US 2019/0229199 A1    Jul. 25, 2019

(51) Int. Cl.
| | | |
|---|---|---|
| *H01L 29/423* | (2006.01) | |
| *H01L 29/40* | (2006.01) | |
| *H01L 21/3065* | (2006.01) | |
| *H01L 21/311* | (2006.01) | |
| *H01L 29/66* | (2006.01) | |
| *H01L 29/78* | (2006.01) | |

(52) U.S. Cl.
CPC .... *H01L 29/42368* (2013.01); *H01L 21/3065* (2013.01); *H01L 21/31116* (2013.01); *H01L 29/401* (2013.01); *H01L 29/6653* (2013.01); *H01L 29/66795* (2013.01); *H01L 29/785* (2013.01)

(58) Field of Classification Search
CPC ............. H01L 29/42368; H01L 29/401; H01L 21/3065; H01L 21/31116; H01L 29/785
USPC ........................................................ 257/401
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2005/0164433 A1* | 7/2005 | Doris ...................... | H01L 21/84 438/149 |
| 2006/0003520 A1* | 1/2006 | Huang ................ | H01L 29/4983 438/222 |
| 2007/0018207 A1* | 1/2007 | Prinz ...................... | B82Y 10/00 257/288 |

(Continued)

*Primary Examiner* — Caleen O Sullivan
(74) *Attorney, Agent, or Firm* — JCIPRNET

(57) ABSTRACT

Semiconductor devices and methods of forming the same are disclosed. A semiconductor device includes a substrate, a gate structure over the substrate, a spacer and a source/drain region. The gate structure is disposed over the substrate. The spacer is disposed on a sidewall of the gate structure, wherein the spacer has a top surface lower than a top surface of the gate structure. The source/drain region is disposed adjacent to a sidewall of the spacer.

20 Claims, 10 Drawing Sheets

(56) References Cited

U.S. PATENT DOCUMENTS

2007/0167011 A1* 7/2007 Hidaka ............... H01L 21/3065
                                                        438/689
2012/0126331 A1* 5/2012 Lin ................. H01L 21/823418
                                                        257/369

* cited by examiner

SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased aspect ratio of a gap between gate structures. Accordingly, a new method for forming semiconductor devices to lower the aspect ratio of the gap is needed.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
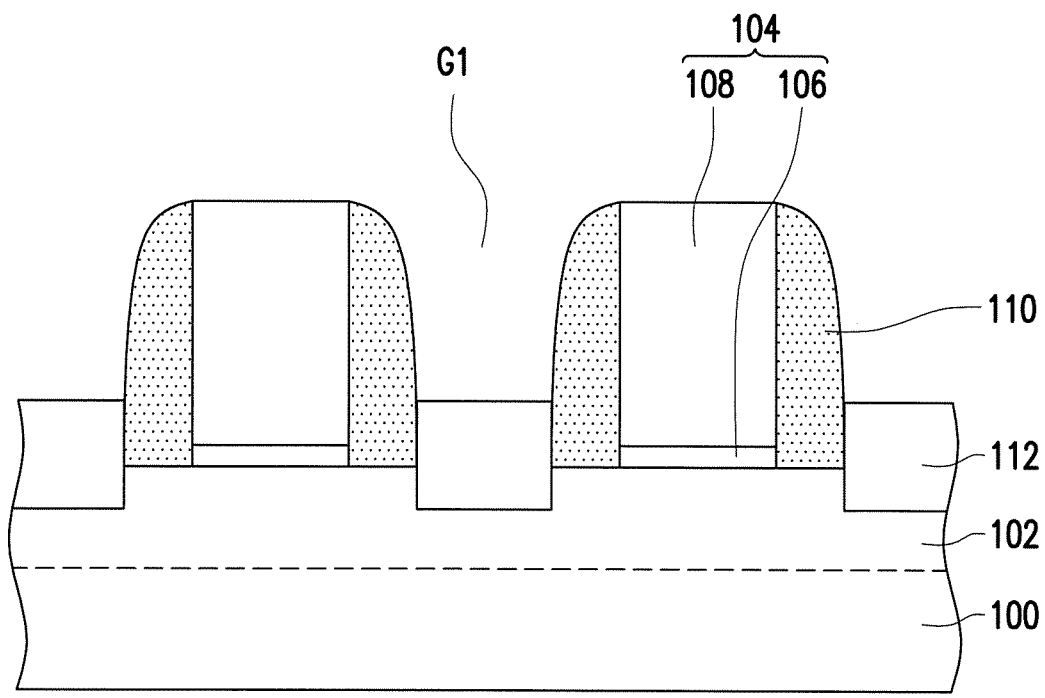
FIGS. 1A to 1E are cross-sectional views at various stages of forming a semiconductor device in accordance with some embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 1E are cross-sectional views at various stages of forming a semiconductor device in accordance with some embodiments of the present disclosure. FIG. 2 illustrates a flow chart illustrating a method of forming a semiconductor device in accordance with some embodiments of the present disclosure. In some embodiments, the semiconductor device is a field effect transistor such as a fin field effect transistor (FinFET). The FinFET refers to any fin-based, multi-gate transistor. In some alternative embodiments, the field effect transistor may be a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC).

In addition, the semiconductor device of FIGS. 1A to 1E may be further processed using CMOS technology processing. Accordingly, it is understood that additional processes may be provided before, during, and after the method of FIG. 2, and that some other processes may only be briefly described herein. Also, FIGS. 1A to 1E are simplified for a better understanding of the concepts of the present disclosure. For example, although the figures illustrate the interconnect structure of a field effect transistor, it is understood the field effect transistor may be part of an IC that further includes a number of other devices such as resistors, capacitors, inductors, fuses, etc.

Figure 2:
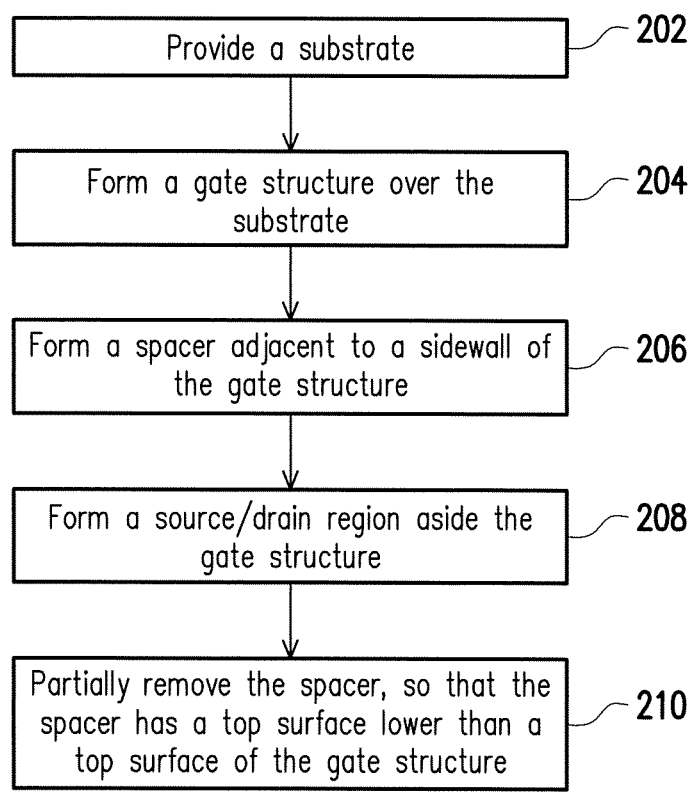
FIG. 2 illustrates a flow chart illustrating a method of forming a semiconductor device in accordance with some embodiments of the present disclosure.

Referring to FIGS. 1A and 2, at step 202, a substrate 100 is provided. In some embodiments, the substrate 100 includes a crystalline silicon substrate (e.g., wafer). The substrate 100 may include various doped regions depending on design requirements (e.g., p-type substrate or n-type substrate). The doped regions may be configured for an n-type FinFET, a p-type FinFET or the combination thereof. In some alternative embodiments, the substrate 100 may be made of some other suitable elemental semiconductor such as diamond or germanium, a suitable compound semiconductor such as gallium arsenide, silicon carbide, indium arsenide or indium phosphide, or a suitable alloy semiconductor such as silicon germanium carbide, gallium arsenic phosphide or gallium indium phosphide.

As shown in FIG. 1A, at least one fin structure 102 is formed on and/or in the substrate 100. In some embodiments, portions of the substrate 100 are removed to define the fin structure 102 protruding from the substrate 100. In some embodiments, the substrate 100 and the fin structure 102 are integrally formed, that is, there is no boundary between the substrate 100 and the fin structure 102. However, other techniques for fabricating the fin structure 102 are possible. In some embodiments, the substrate 100 and the fin structure 102 are made of a same material.

In some embodiments, an isolation structure (not shown) is formed between the fin structures 102, such as a local oxidation of silicon (LOCOS) or a shallow trench isolation (STI) structure. The isolation structure is configured to isolate the two fin structures 102. The isolation structure may be formed by filling a trench between the fin structures 102 with a dielectric material. In some embodiments, the dielectric material may include silicon oxide, silicon nitride, silicon oxynitride, fluoride-doped silicate glass (FSG), a spin-on dielectric material, a low-k dielectric material, any other suitable dielectric material or a combination thereof. In some embodiments, the isolation structure may have a multi-layer structure such as a thermal oxide liner layer filled with silicon nitride or silicon oxide.

In some embodiments, the fin structure 102 is an active region. In some alternative embodiments, the active regions may be formed in the substrate 100 and include various doping configurations depending on design requirements as known in the art. In some alternative embodiments, the active regions may be doped with p-type or n-type dopants. For example, the active regions may be doped with p-type dopants such as boron or $BF_2$, n-type dopants such as phosphorus or arsenic and/or combinations thereof.

Referring to FIGS. 1A and 2, at step 204, a gate structure 104 is formed over the substrate 100. In some embodiments, the gate structure 104 includes a gate dielectric layer 106 and a gate electrode 108 formed crossing over the fin structures 102. The gate electrode 108 is a dummy gate and will be removed later to form a cavity, and a conductive material will then be formed in the cavity to form a real gate. In some embodiments, the gate dielectric layer 106 and the gate electrode 108 are formed by forming a gate dielectric material (not shown) and a dummy gate electrode material (not shown) over the fin structure 102 sequentially, and then performing a patterning process on the dummy gate electrode material and the gate dielectric material. In some embodiments, the gate dielectric material may include silicon oxide, silicon nitride, silicon oxynitride, high-k dielectrics, any other suitable dielectric material or a combination thereof. The gate dielectric material may be formed using a suitable process such as atomic layer deposition (ALD), chemical vapor deposition (CVD), physical vapor deposition (PVD), thermal oxidation process, UV-ozone oxidation, or combinations thereof. In some embodiments, the gate dielectric layer 106 may further include an interfacial layer (not shown) to minimize stress between the gate dielectric layer 106 and the fin structure 102.

In some embodiments, the dummy gate electrode material may include a single layer or multilayer structure. In some embodiments, the dummy gate electrode material may include a silicon-containing material, such as poly-silicon, amorphous silicon, or metal, such as Al, Cu, W, Ti, Ta, TiN, TiAl, TiAlN, TaN, NiSi, CoSi, other conductive materials with a work function compatible with the substrate material, or combinations thereof. The dummy gate electrode material may be formed over the gate dielectric material by deposition, such as ALD, CVD, PVD, LPCVD (low-pressure CVD), plating, or combinations thereof. In some embodiments, the patterning process, such as photolithography and etching processes, is performed on the dummy gate electrode material and the gate dielectric material therebeneath to form the gate electrode 108 and the gate dielectric layer 106 crossing over the fin structures 102. The gate electrode 108 may have any suitable thickness. In some embodiments, the gate electrode 108 has a height in the range of about 5 nm to about 50 nm.

In some alternative embodiments, a hard mask layer (not shown) may be formed over the gate electrode 108 to protect the gate electrode 108. The hard mask layer may include silicon nitride, for example. In some alternative embodiments, after the hard mask layer is deposited and patterned, the dummy gate electrode material and the gate dielectric material are patterned through the hard mask layer, thereby forming a gate structure including the hard mask layer, the dummy gate electrode and the gate dielectric layer.

Still referring to FIGS. 1A and 2, at step 206, a spacer 110 is formed adjacent to a sidewall of the gate structure 104. In some embodiments, the spacer 110 is formed on the sidewall of the gate structure 104, and thus the sidewall of the gate structure 104 is covered. In other words, the spacer 110 has a top surface 110a substantially flush with a top surface 104a of the gate structure 104, and a height of the spacer 110 with respect to a top surface of the substrate 100 is substantially equal to a height of the gate structure 104 with respect to the top surface of the substrate 100. In some embodiments, the spacer 110 is a single layer spacer, for example. In some alternative embodiments, the spacer 110 may include a multilayer structure. In some embodiments, the spacer 110 has a top portion having a curved sidewall and a bottom portion having a substantially vertical sidewall connecting to the top portion. A width of the spacer 110 on one side of the gate structure 104 may be in the range of about 2 nm to 20 nm. In some embodiments, a gap G1 is formed between the spacers 110 and has a substantially constant width, and the aspect ratio of the gap G1 is larger than 1, which may cause a difficulty of gap-filling of insulating materials. The spacer 110 may be formed by depositing a dielectric material (not shown) to cover the gate structure 104 and then anisotropically etching the dielectric material to form the spacer 110 over the sidewall of the gate structure 104. In some embodiments, the spacer 110 is formed of dielectric materials, such as silicon oxide, silicon nitride, silicon oxynitride, silicon carbon nitride, fluoride-doped silicate glass (FSG), a low k dielectric material, any other suitable dielectric material or a combination thereof.

Referring to FIGS. 1A and 2, at step 208, a source/drain region 112 is formed aside the gate structure 104. In some embodiments, the source/drain region 112 is formed in the fin structure 102 and/or the substrate 100 adjacent to the gate structure 104. In some embodiments, the source/drain region 112 is formed between the adjacent spacers 110, and a silicide (not shown) is selectively formed on the surface of the source/drain region 112. In some embodiments, the source/drain region 112 may be formed by the following steps. First, the portions of the fin structure 102 are removed to form recesses using photolithography and etching processes. Then, the source/drain region 112 may be respectively epitaxially (epi) grown in the recesses. In some embodiments, the source/drain region 112 protrudes from the recesses and has an upper surface higher than an upper surface of the fin structure 102, the disclosure is not limited thereto. In some alternative embodiments, the source/drain region 112 may has an upper surface leveled with a top surface of the fin structure 102 or the substrate 100. In addition, although the source/drain region 112 is shaped as a rectangle, the disclosure is not limited thereto. In some alternative embodiment, the source/drain region 112 may be shaped as a diamond or other suitable shape.

Figure 1B:
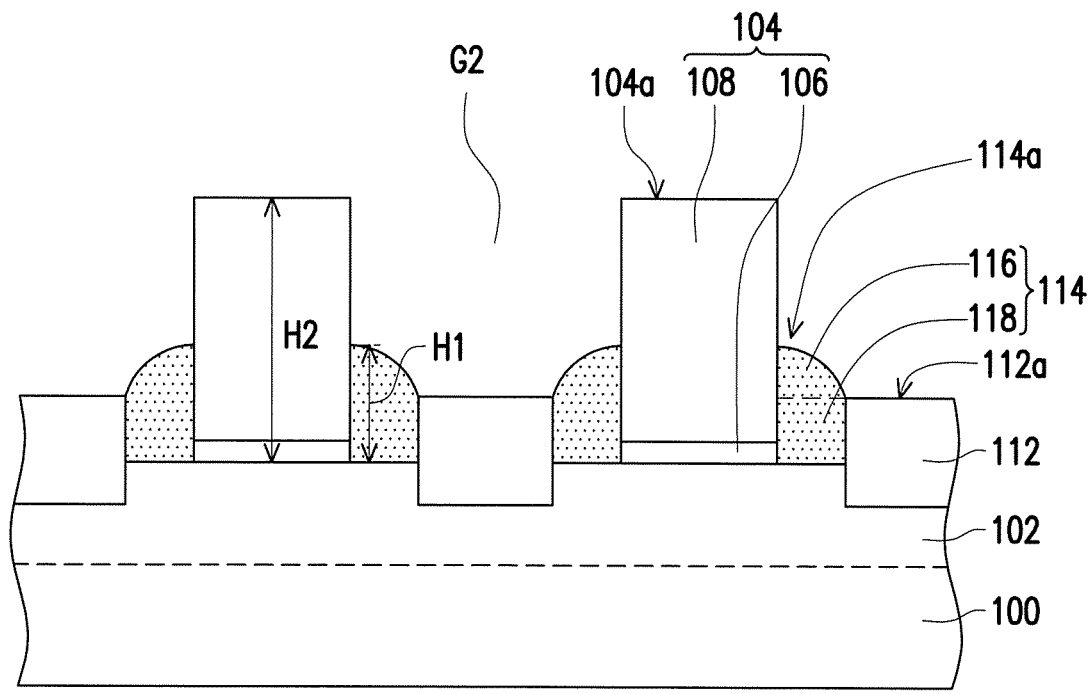

Referring to FIGS. 1B and 2, at step 210, a portion of the spacer 110 is removed, so that the spacer 114 has a top surface 114a lower than the top surface 104a of the gate structure 104. In some embodiments, the spacer 114 is a single layer spacer, for example. In some alternative embodiments, the spacer 114 may include a multilayer structure. In some embodiments, the portion of the spacer 110 is removed by an anisotropically etching process such as a dry etching process. In some embodiments, the etchant used to remove the portion of the spacer 110 has a high selectivity among the spacer 110, the gate structure 104 and the source/drain region 112. Therefore, the gate structure 104 and the source/drain region 112 may be kept intact without being damaged. In some alternative embodiments, during the removal process of the spacers 110, a mask may be used to cover other spacers (not shown) which will be kept intact or formed as other shapes different from the spacer 110.

In some embodiments, the top portion of the spacer 110 is partially removed, and thus a top portion of the sidewall of the gate structure 104 (such as the sidewall of the gate electrode 108) is exposed. In other words, a height H1 of the spacer 114 with respect to the top surface of the substrate 100 is substantially smaller than a height H2 of the gate structure 104 with respect to the top surface of the substrate 100. In some embodiments, a gap G2 is partially formed between the gate structures 104 and partially formed between the spacers 114, and thus the gap G2 has at least two widths. Since a width of a portion of the gap G2 between the gate electrodes 104 exposed by the spacers 114 is larger than a width of the gap G1 between the spacers 110 in FIG. 1A, the aspect ratio of the gap G2 is smaller than that of the gap G1. In some embodiments, the aspect ratio of the gap G2 is smaller than 50% of the aspect ratio of the gap G1, for example. In some embodiments, in order to have an optimized gap-filling effect, the height H1 of the spacer 114 is not more than 50 percent of the height H2 of the gate structure 104. In other words, in an embodiment, at least half height of the spacer 110 shown in FIG. 1A is removed. In some embodiments, the top surface 114a of the spacer 114 is disposed between the top surface 104a of the gate structure 104 and a top surface 112a of the source/drain region 112.

In some embodiments, the spacer 114 has a top portion 116 and a bottom portion 118 disposed beneath and integrally formed with the top portion 116. In some embodiments, the top portion 116 protrudes from the source/drain region 112, and the top portion 116 is disposed between the top surfaces 104a, 112a of the gate structure 104 and the source/drain region 112. In some embodiments, the bottom portion 118 fills in a cavity formed between the sidewalls of the gate structure 104 and the source/drain region 112, and a top surface (as shown by dashed line) of bottom portion 118 is leveled with the top surface 112a of the source/drain region 112, for example. In some embodiments, at least a portion of the sidewall of the bottom portion 118 is in physical contact with the sidewall of the source/drain region 112. In this embodiment, an entire sidewall of the bottom portion 118 is substantially in physical contact with the sidewall of the source/drain region 112, for example. In some embodiments, the top portion 116 has a curved (outer) sidewall and the bottom portion 118 having a substantially vertical (outer) sidewall.

In some embodiments, the spacer 110 is partially removed to form the spacer 114 after forming the source/drain region 112, but the disclosure is not limited thereto. In some alternative embodiments, the spacer 110 may be partially removed to form the spacer 114 before forming the source/drain region 112. Furthermore, although the spacer 114 is formed from the spacer 110 by partially removing in this embodiment, the disclosure is not limited thereto. In some alternative embodiments, the formation of the spacer 110 may be omitted, that is, the spacer 114 may be directly formed by depositing a dielectric material covering the gate structure 104 and then anisotropically etching the dielectric material to form the spacer 114 exposing a portion the sidewall of the gate structure 104.

Figure 1C:
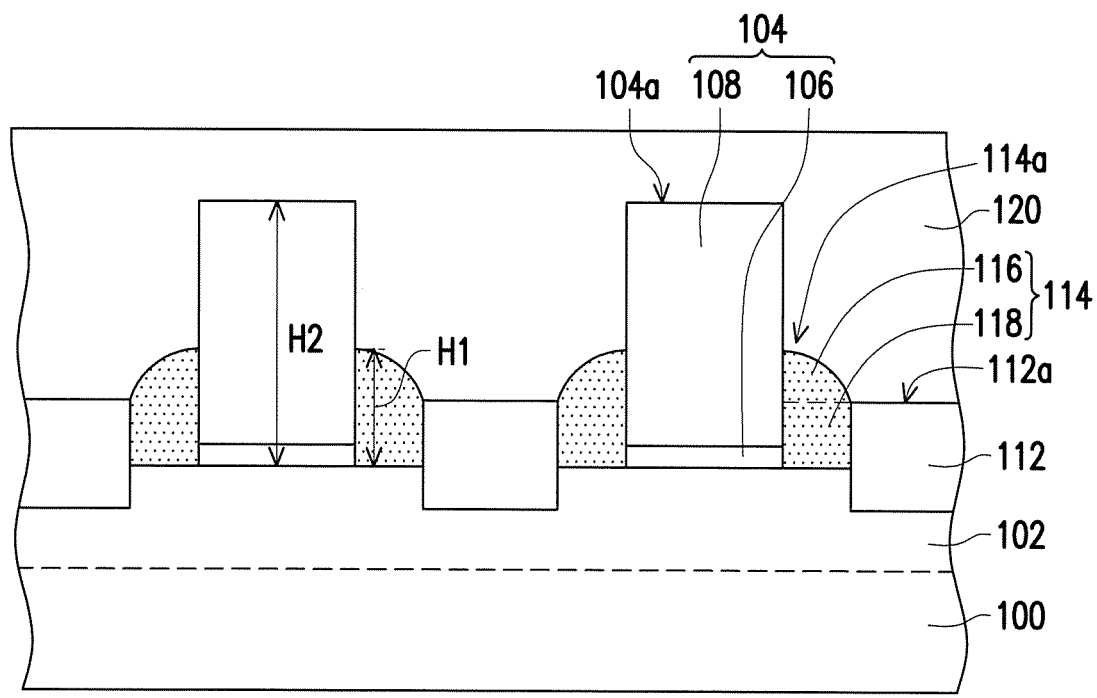

Referring to FIGS. 1C and 2, at step 212, an inter-layer dielectric (ILD) 120 is formed over the substrate 100 to cover the gate structures 104 and fills in the gap G2 between the gate structures 104. In some embodiments, the ILD 120 may be formed of an oxide, a carbon-containing dielectric, boronphosphorous silicate glass (BPSG), phosphorous silicate glass (PSG), spin-on glass (SOG), tetra-ethyl-orthosilicate (TEOS) oxide, or the like. The formation method of the ILD 120 may include high-density plasma chemical vapor deposition (HDPCVD), high-aspect ratio process (HARP), or the like.

Compared to a substantially constant width of the gap G1 in FIG. 1A, a width of a portion of the gap G2 partially formed between the gate structures 104 exposed by the spacers 114 is larger. Accordingly, the aspect ratio of the gap G2 is lowered, and the likelihood for voids to be formed in the ILD 120 is reduced. In other words, by tuning the shape of the spacer 114, a better gap-filling of the ILD 120 can be achieved.

Figure 1D:
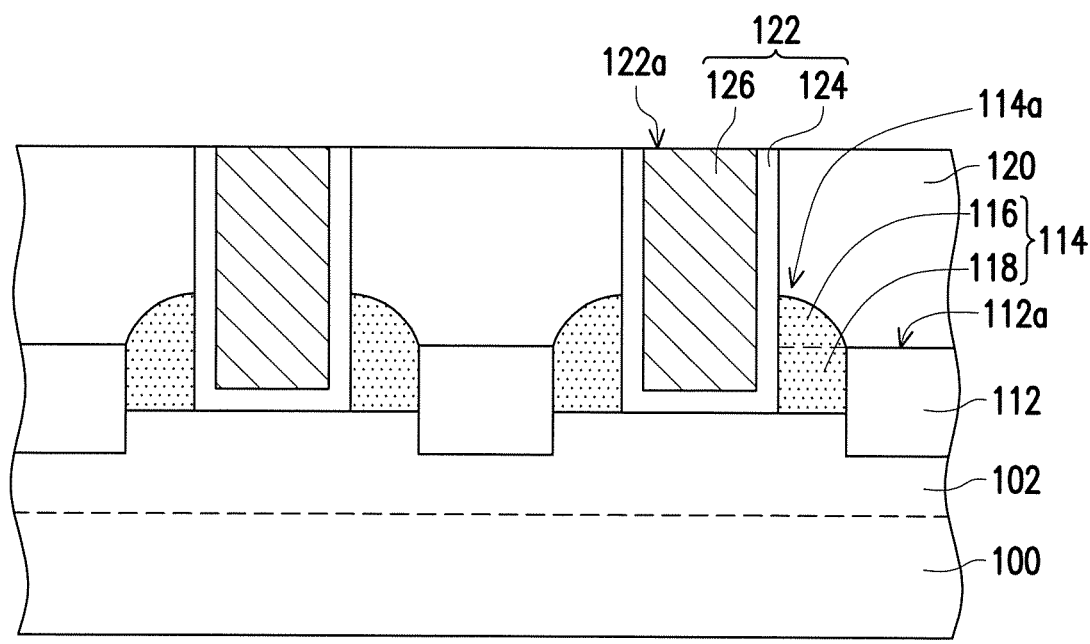

Referring to FIG. 1D, in some embodiments, a gate structure 104 is replaced by a gate structure 122. In some embodiments, the gate structure 122 includes a gate dielectric layer 124 and a gate electrode 126, and the top surface 114a of the spacer 114 is lower than a top surface 122a of the gate structure 122. In some embodiments, the gate structure 122 is formed by the following steps. First, a chemical mechanical polish (CMP) is performed to the structure of FIG. 1C. The CMP stops at the top surface of the gate electrode 108. Accordingly, the top surface of the ILD 120 is leveled with the top surface of the gate electrode 108. After the CMP, the top surface of the gate electrode 108 is exposed. Next, the gate electrode 108 and the gate dielectric layer 106 are removed to form an opening (the space occupied by the spacer 114 and the ILD 120). Then, a gate dielectric layer, preferably formed of a high-k dielectric material, is blanket formed, followed by the filling of a conductive material into the opening. An additional CMP is then performed to remove portions of the gate dielectric layer and the conductive material over the ILD 120. The remaining gate dielectric layer and the metallic material in the opening form the gate dielectric layer 124 and the gate electrode 126 of the gate structures 122 in the resulting semiconductor device. Although not shown, some of the gate structures 104 may also be replaced using the gate-last approach or may be preserved as they are.

Figure 1E:
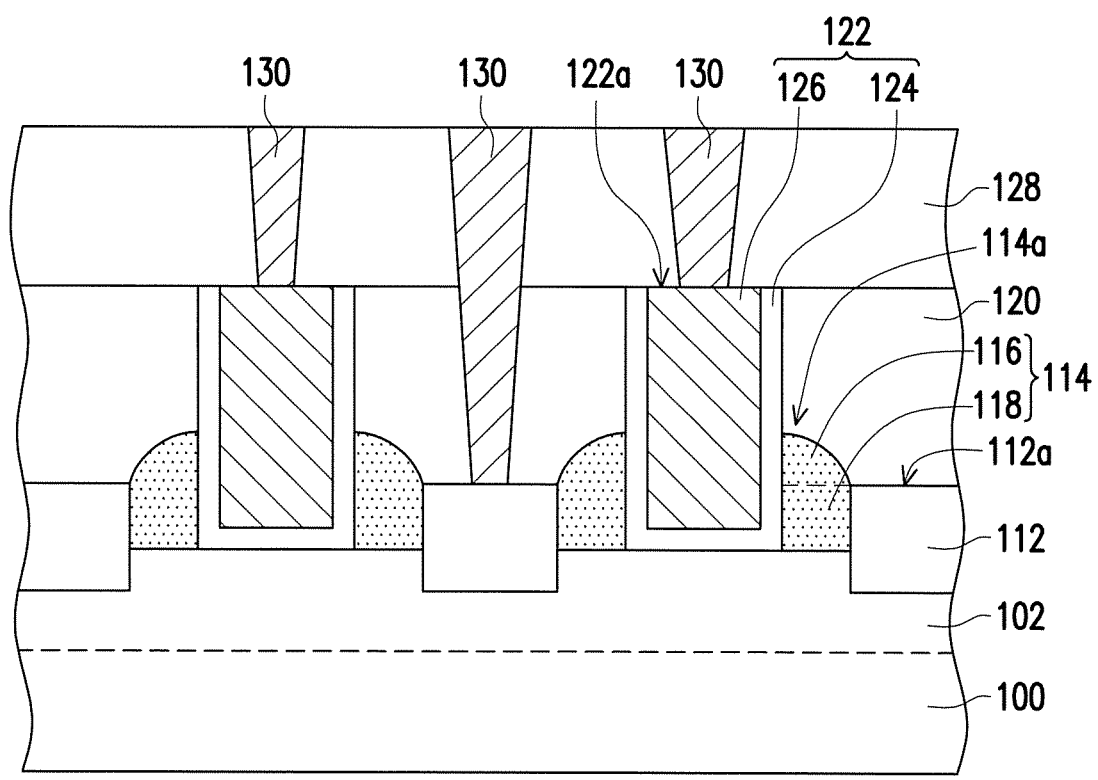

Referring to FIG. 1E, in some embodiments, an ILD 128 is formed, and then contact plugs 130 are formed in the ILD 128. The contact plugs 130 are electrically connected to the gate electrode 126 and the source/drain region 112.

Figure 3A:
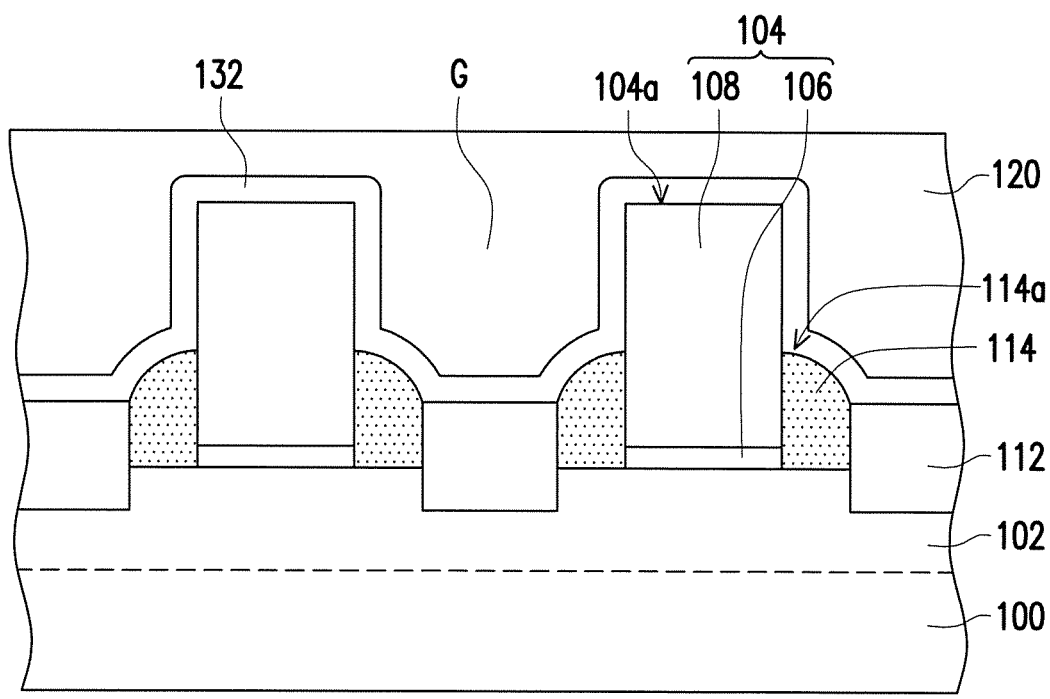
FIGS. 3A to 3C are cross-sectional views at various stages of forming a semiconductor device in accordance with some embodiments of the present disclosure.
Figure 3B:
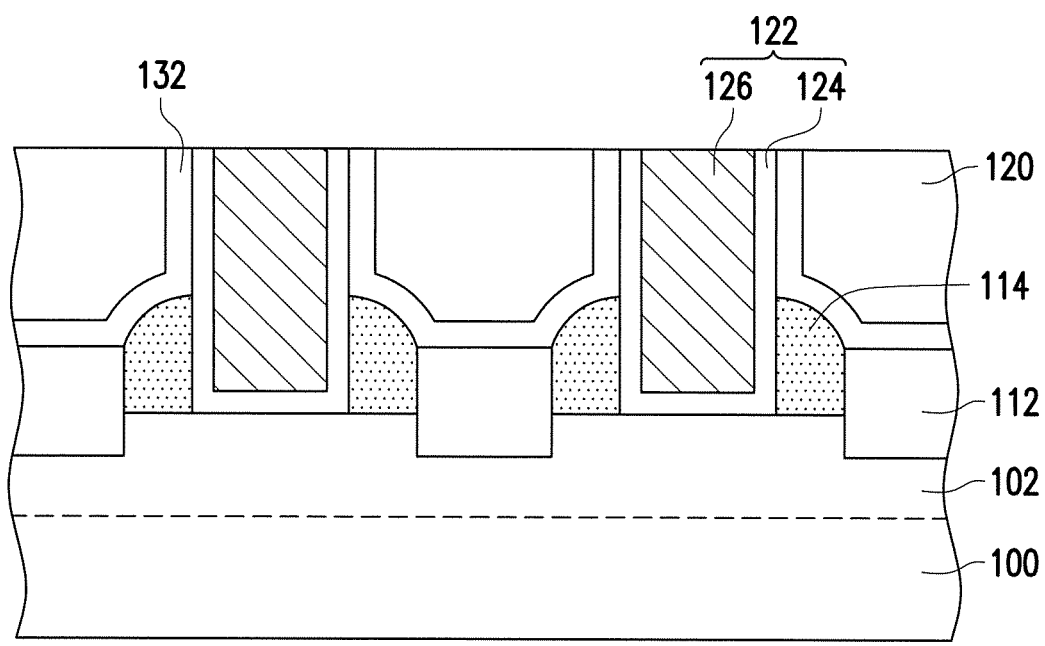
Figure 3C:
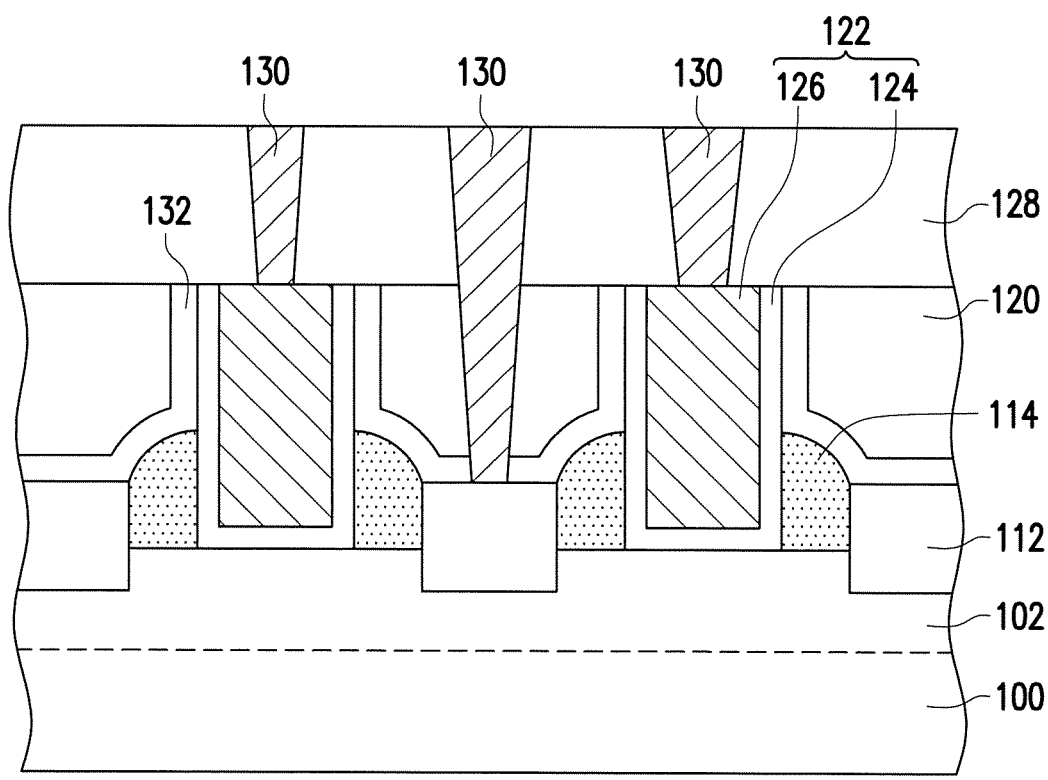

FIGS. 3A to 3C are cross-sectional views at various stages of forming a semiconductor device in accordance with some embodiments of the present disclosure. A method of FIGS. 3A to 3C is performed on the structure of FIG. 1B, and is similar to the method as shown in FIGS. 1C to 1E, except forming a contact etch stop layer (CESL). Referring to FIG. 3A, after forming a spacer 114 having a top surface 114a lower than a top surface 104a of a gate structure 104, a CESL 132 is formed over a substrate 100 to cover a source/drain region 112 and the gate structure 104. In some embodiments, in addition to the top surfaces of the source/drain region 112 and the gate structure 104, the CESL 132 is also in contact with the spacer 114 on a portion of a sidewall of the gate structure 104 (such as the sidewall of a gate electrode 108) and a portion of the sidewall of the gate structure 104 exposed by the spacer 114. According to the type of semiconductor device to be formed, appropriate materials and corresponding formation processes are selected for the CESL 132 to apply either compressive or tensile strain to the channel region of the underlying semiconductor device. The materials of the CESL 132 include materials such as nitride, oxynitride, oxide, SiC, SiON, and combinations thereof.

Then, an ILD 120 is formed over the CESL 132 to fill a gap G between the gate structures 104. In some embodiments, the gap G is partially formed between the spacers 114 and partially formed between the gate structures 104 exposed by the spacers 114, and thus the aspect ratio of the gap G is smaller than that of the gap G1 shown in FIG. 1A. Accordingly, the likelihood for voids to be formed in the ILD 120 is reduced, and a good gap-filling of the ILD 120 can be achieved.

Referring to FIG. 3B, a gate structure 104 is replaced by a gate structure 122. In some embodiments, first, a chemical mechanical polish (CMP) is performed. The CMP stops at the top surfaces of the gate electrodes 108. Accordingly, the top surface of the CESL 132 is leveled with the top surfaces of the gate electrodes 108. After the CMP, the top surfaces of gate electrodes 108 are exposed. Next, the gate electrode 108 and the gate dielectric layer 106 are removed to form an opening (the space occupied by the CESL 132 and the spacer 114). Then, a gate dielectric layer is blanket formed, followed by the filling of a conductive material into the opening. An additional CMP is then performed to remove portions of the gate dielectric layer and the conductive material over the ILD 120. The remaining gate dielectric layer and the metallic material in the opening form a gate dielectric layer 124 and a gate electrode 126 of the gate structure 122 in the resulting semiconductor device. In some embodiments, a sidewall of the gate structure 122 is partially exposed by the spacer 114, and thus the CESL 132 is in contact with the sidewall of the gate structure 122 such as the sidewall portion of the gate dielectric layer 124.

Referring to FIG. 3C, in some embodiments, an ILD 128 is formed, and then contact plugs 130 are formed in the ILD 128. The contact plugs 130 are electrically connected to the gate electrode 126 and the source/drain region 112.

Figure 4A:
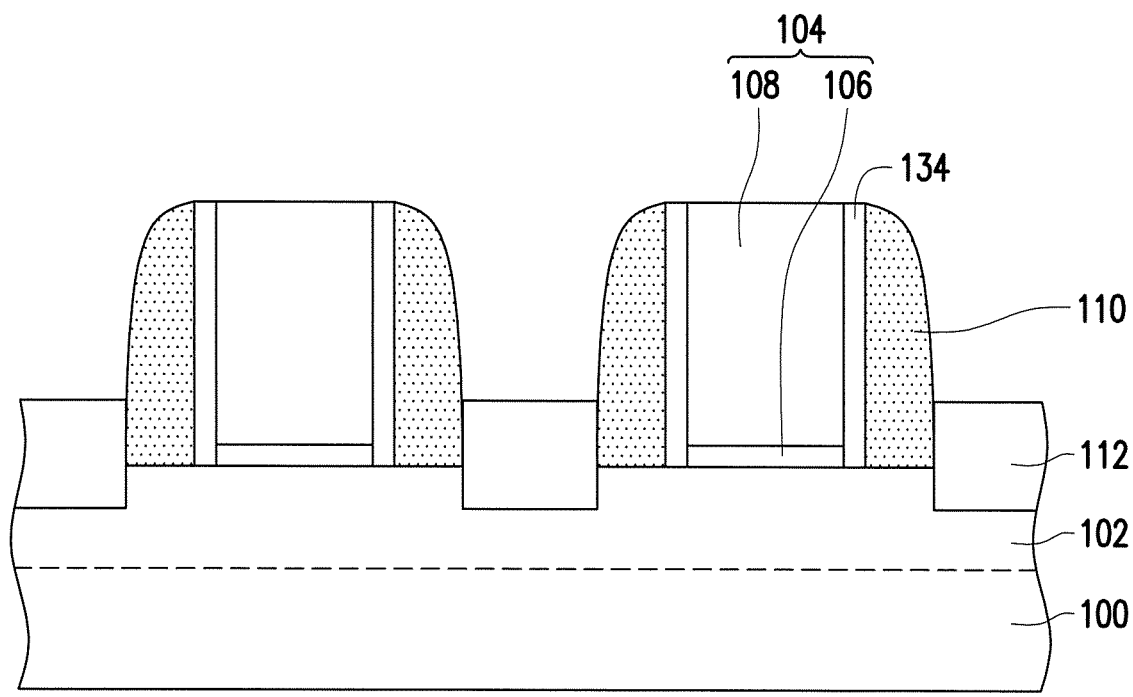
FIGS. 4A to 4C are cross-sectional views at various stages of forming a semiconductor device in accordance with some embodiments of the present disclosure.
Figure 4B:
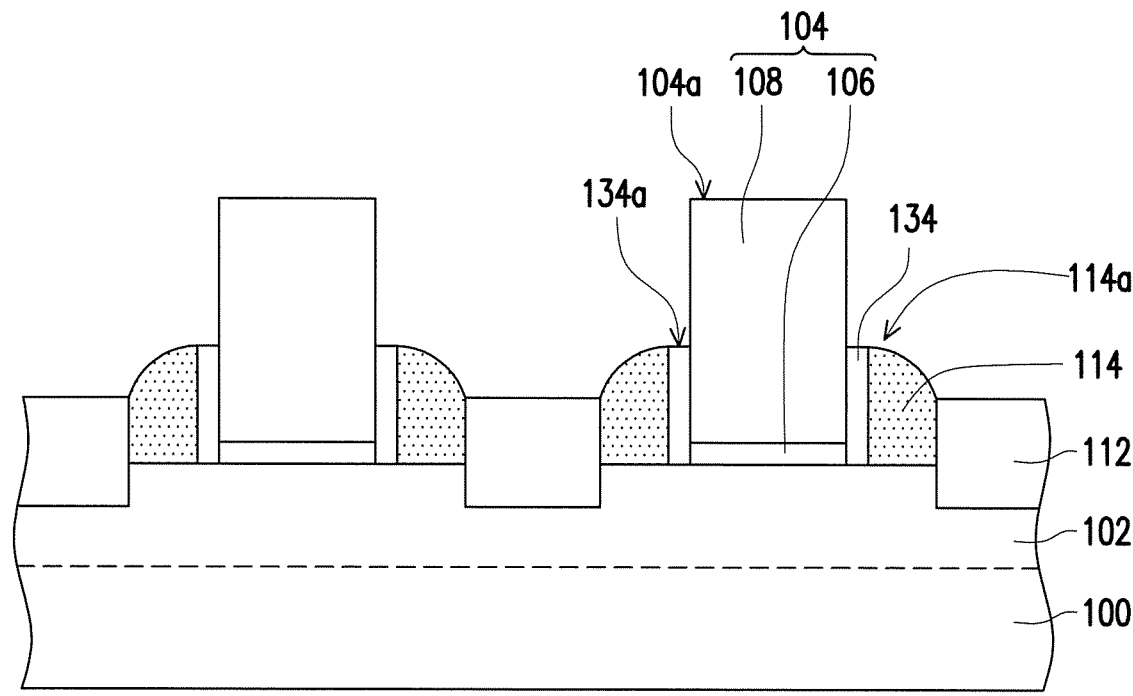
Figure 4C:
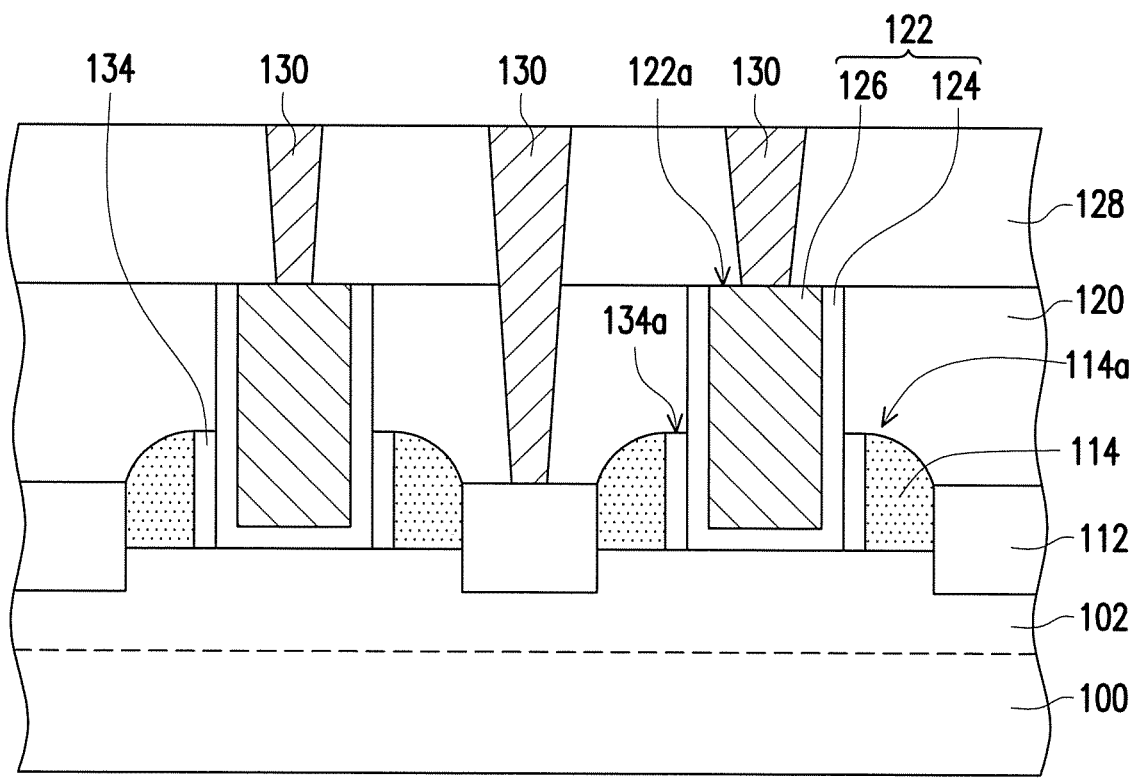

FIGS. 4A to 4C are cross-sectional views at various stages of forming a semiconductor device in accordance with some embodiments of the present disclosure. A method of FIGS. 4A to 4C is similar to the method as shown in FIGS. 1A to 1E, except forming a seal layer. Referring to FIG. 4A, in some embodiments, a seal layer 134 is formed on a sidewall of a gate electrode 108 over a substrate 100. In some embodiments, the seal layer 134 may be formed of silicon nitride. In some embodiments, the seal layer 134 is formed by blanket depositing a dielectric layer and patterning the dielectric layer, for example, using a dry etching process. Then, a spacer 110 is formed on the seal layer 134. In some embodiments, a top surface of the seal layer 134 is substantially leveled with a top surface of the spacer 110. Next, a source/drain region 112 is formed in a fin structure 102 and/or in the substrate 100 adjacent to the gate structure 110.

Referring to FIG. 4B, portions of the seal layer 134 and the spacer 110 are removed. In some embodiments, a top surface 114a of the spacer 114 is substantially flush with a top surface 134a of the seal layer 134 and lower than a top surface 104a of the gate structure 104. In some embodiments, portions of the seal layer 134 and the spacer 110 may be removed simultaneously or separately. After removal, a sidewall of the gate electrode 108 is exposed.

Figure 5:
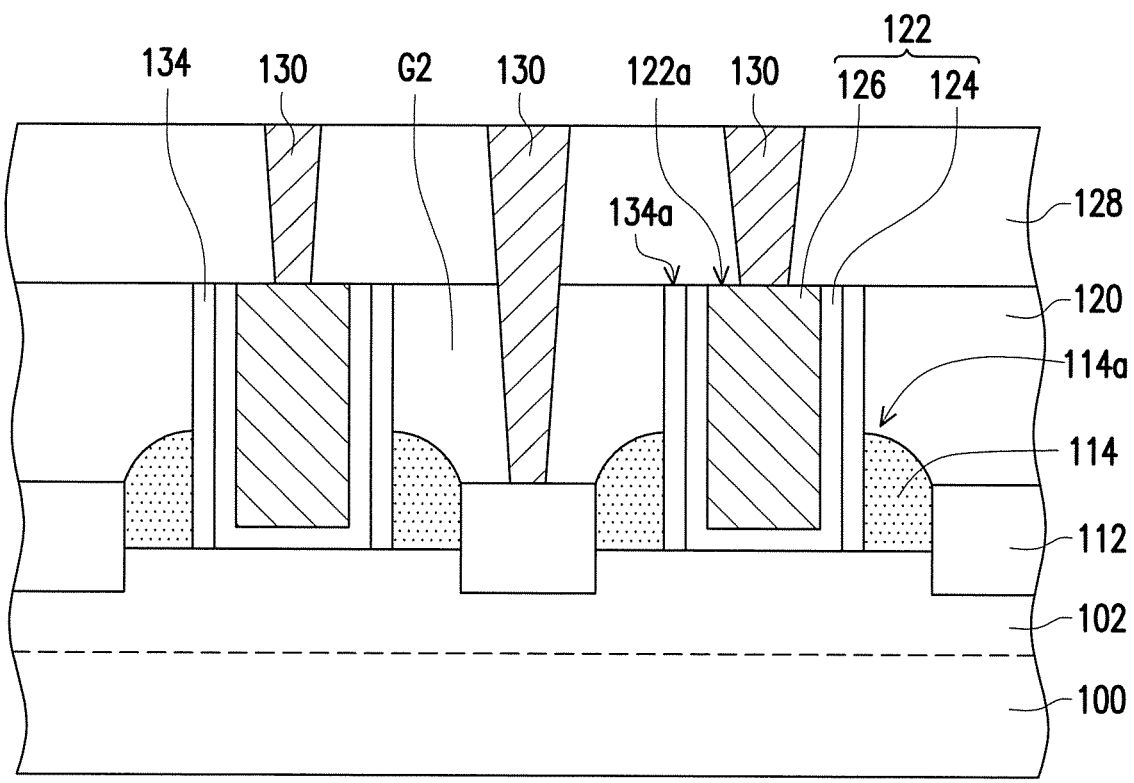
FIG. 5 is a cross-sectional view of a semiconductor device in accordance with some embodiments of the present disclosure.

Referring to FIG. 4C, an ILD layer 120 is formed over the substrate 100 and exposes the top surfaces of the gate structure 104. Then, the gate structure 104 is replaced by a gate structure 122. In some embodiments, the top surface 114a of the spacer 114 is substantially flush with the top surface 134a of the seal layer 134 and lower than a top surface 122a of the gate structure 122. Next, an ILD 128 is formed, and then contact plugs 130 are formed in the ILD 128 to electrically connect to a gate electrode 126 and the source/drain region 112. In some embodiments, a sidewall of the gate structure 122 (such as the sidewall portion of the gate dielectric layer 124) is partially exposed by the spacer 114 and the seal layer 134, and thus the ILD layer 120 is physical in contact with the sidewall portion of the gate dielectric layer 124, for example. In some alternative embodiments, the seal layer 134 in FIG. 4B may be kept intact without being partially removed, and thus as shown in FIG. 5, the seal layer 134 is disposed on the sidewall portion of the gate dielectric layer 124. In this embodiment, the top surface 134a of the seal layer 134 is leveled with the top surface of the gate structure 122 (such as the top surfaces of the gate electrode 126 and the sidewall portion of the gate dielectric layer 124) and higher than the top surface 114a of the spacer 114.

Figure 6A:
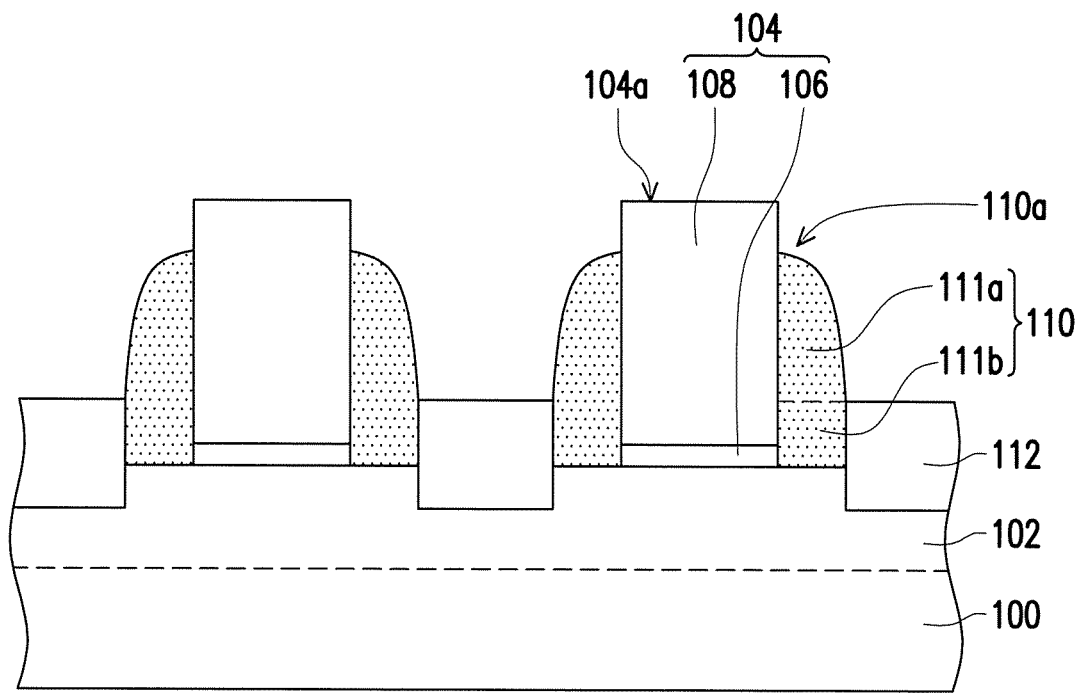
FIGS. 6A to 6C are cross-sectional views at various stages of forming a semiconductor device in accordance with some embodiments of the present disclosure.
Figure 6B:
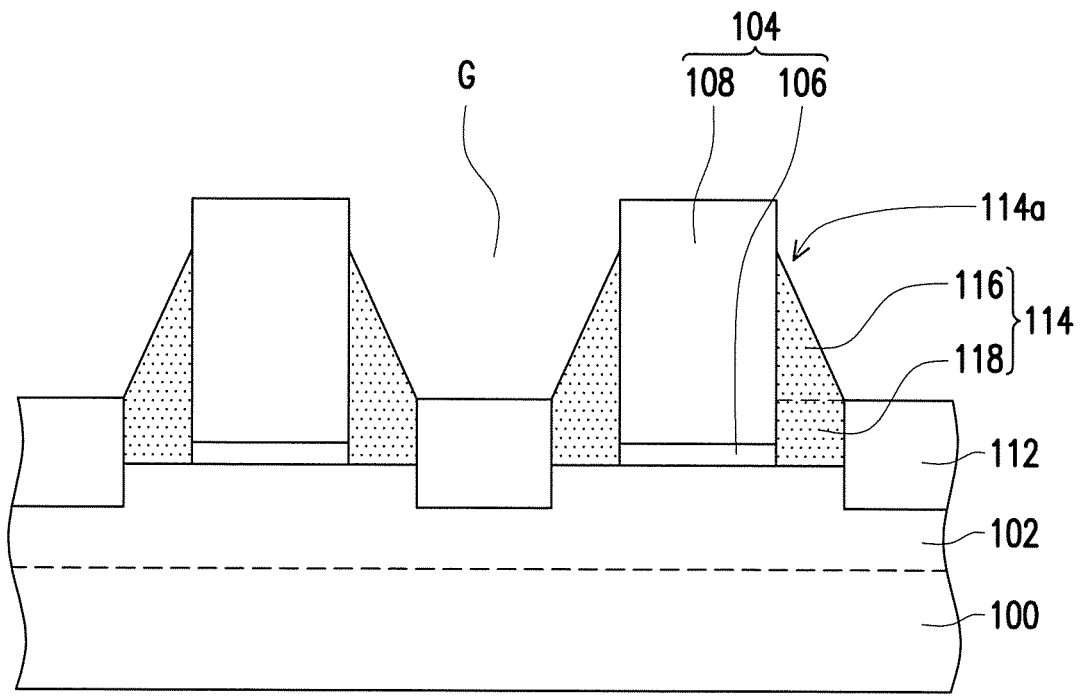
Figure 6C:
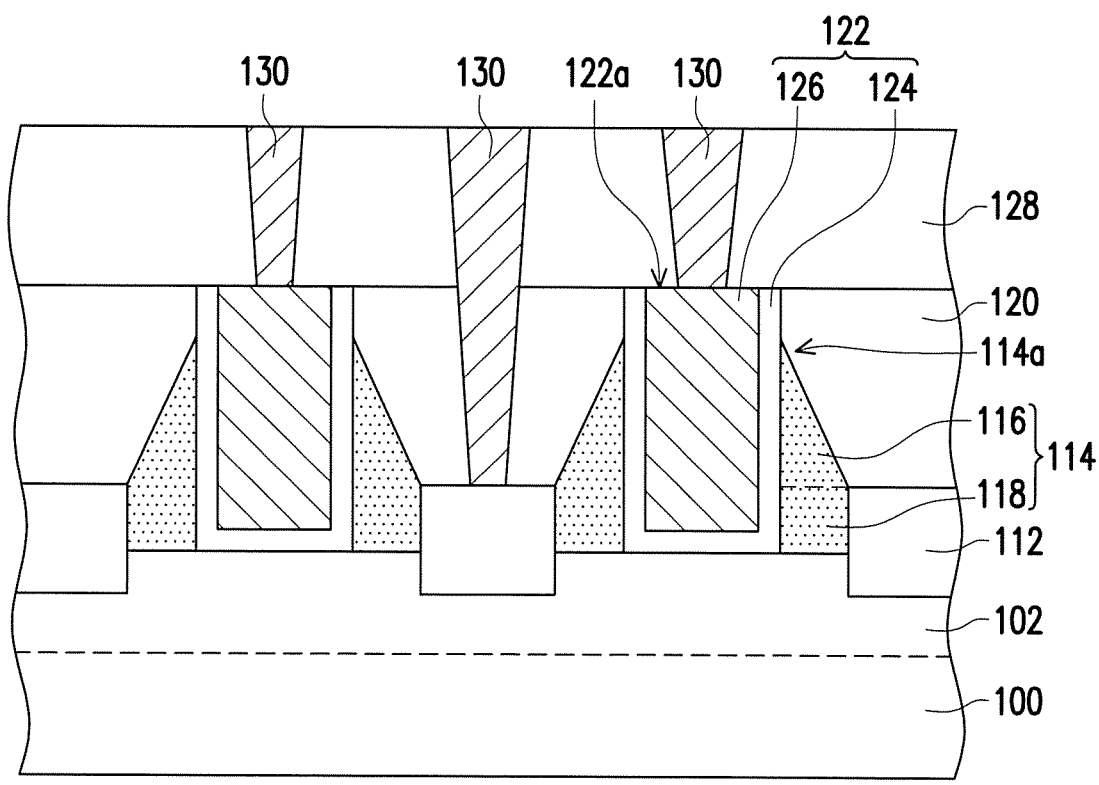

FIGS. 6A to 6C are cross-sectional views at various stages of forming a semiconductor device in accordance with some embodiments of the present disclosure. A method of FIGS. 6A to 6C is similar to the method as shown in FIGS. 1B to 1E is described, except the shape and forming method of the spacer. Referring to FIGS. 1B, 6A and 6B, a portion of a spacer 110 is removed, so as to form a spacer 114 including a top portion 116 with a steep (outer) sidewall and a bottom portion 118 with a substantially vertical (outer) sidewall. In some embodiments, the portion of the spacer 110 may be removed by a first etching process and a second etching process sequentially, for example. First, as shown in FIG. 6A, a top portion of the spacer 110 shown in FIG. 1A is etched by the first etching process, and thus a top surface 110a of the spacer 110 is lower than a top surface 104a of the gate structure 104. The etched spacer 110 includes a top portion 111a having a curved sidewall and a bottom portion 111b having a substantially vertical sidewall in contact with a source/drain region 112. Then, as shown in FIG. 6B, the top portion 111a of the spacer 110 is partially etched by the second etching process, so as to form the top portion 116 having a steep sidewall. In other words, the shape of the top portion 111a of the spacer 110 is tuned by the second etching process. In some embodiments, a top surface of the top portion 116 may be substantially equal to or lowered than the top surface 110a of the spacer 110. In some embodiments, the shape-tuning method for the top portion 111a of the spacer 110 includes controlling the pressure of the etching gases, the plasma power of the etching process and a ratio of carbon to fluoride in the etching gases, the like or a combination thereof. In some embodiments, compared with the first etching process, in the second etching process, the pressure of the etching gases, the plasma power, a ratio of carbon to fluoride, the like or a combination thereof is increased to causes a tapper sidewall. In an embodiment, the etching gases include $CF_3$ and $CF_4$, and a ratio of $CF_3$ to $CF_4$ in the second etching process is larger than that in the first etching process. For example, 10% of $CF_3$ and 90% of $CF_4$ is used in the first etching process, and 30% of $CF_3$ and 70% of $CF_4$ is used in the second etching process.

Referring to FIG. 6C, an ILD layer 120 is formed over the substrate 100 and exposes the top surfaces of the gate structures 104. In some embodiments, a gap G has much more sloped sidewalls (which may result in the gap G having a V-shape) than a gap G formed between the spacer 110. Accordingly, the likelihood for voids to be formed in the ILD 120 is reduced, and a good gap-filling of the ILD 120 can be achieved. Then, the gate structure 104 is replaced by a gate structure 122. Next, an ILD 128 is formed, and then contact plugs 130 are formed in the ILD 128 to electrically connect to a gate electrode 126 and the source/drain region 112. In some embodiments, the sidewall portion of the gate dielectric layer 124 is exposed by the spacer 114, and the ILD layer 120 is physical in contact with the sidewall portion of the gate dielectric layer 124, for example.

Figure 7:
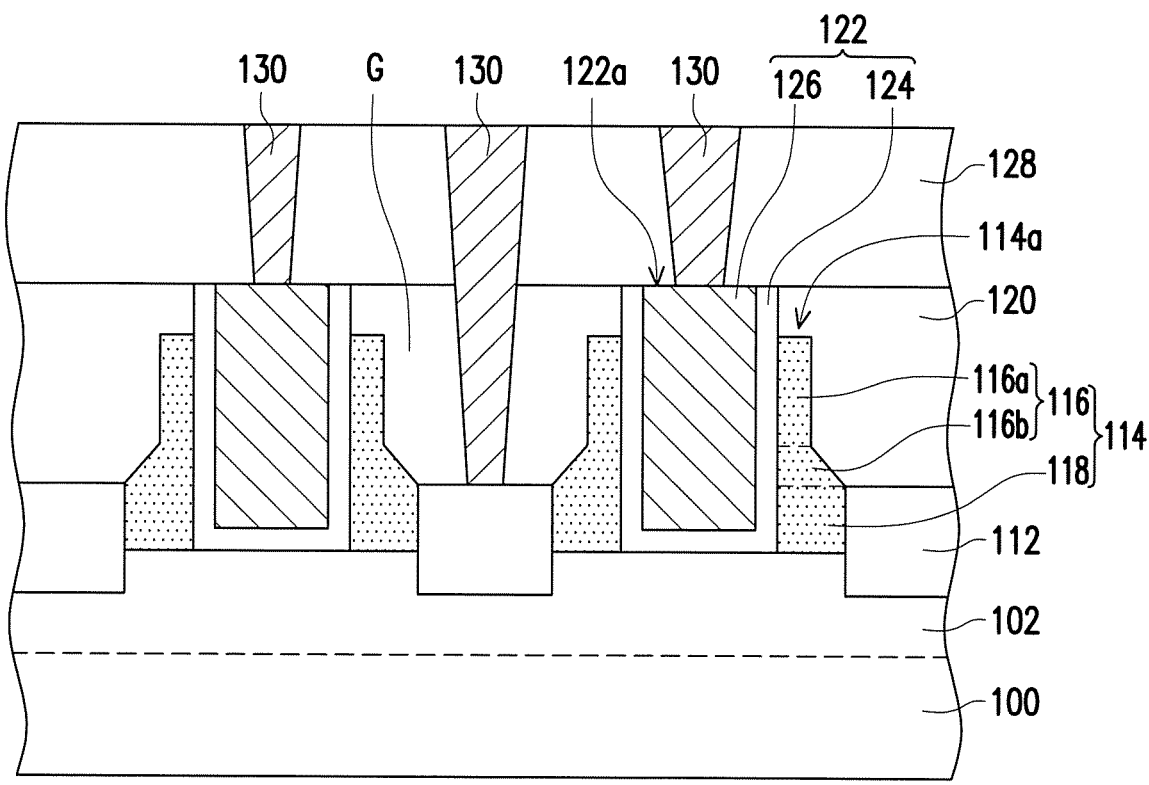
FIG. 7 is a cross-sectional view of a semiconductor device in accordance with some embodiments of the present disclosure.

FIG. 7 is a cross-sectional view of a semiconductor device in accordance with some embodiments of the present disclosure. A semiconductor device of FIG. 7 similar to the method as shown in FIG. 6C is described, except the shape of the spacer. Referring to FIG. 7, a spacer 114 includes a top portion 116 and a bottom portion 118, the top portion 116 has a substantially vertical (outer) sidewall 116a and a steep (outer) sidewall 116b, the bottom portion 118 has a substantially vertical sidewall 118a, and the steep sidewall 116b is disposed between and connects the substantially vertical sidewall 116a and the substantially vertical sidewall 118a. In some embodiments, a top surface 114a of the spacer 114 (such as a top surface of the top portion 116) is lower than a top surface 122a of a gate structure 122 and substantially horizontal. In some embodiments, since at least one width of a gap G shown in FIG. 7 is larger than a substantially constant width of a gap G1 shown in FIG. 1A, the aspect ratio of the gap G is smaller than that of the gap G1. Accordingly, the likelihood for voids to be formed in the ILD 120 is reduced, and a good gap-filling of the ILD 120 can be achieved.

In some embodiments, the top surface of the spacer is lower than the top surface of the gate structure, and thus a portion of the sidewall of the gate structure is exposed. Accordingly, the gap to be filled by the ILD is partially formed between the adjacent gate structures exposed by the spacers and partially formed between the adjacent spacers. Therefore, compared with the aspect ratio of the gap formed between the spacers which is not shape-tuned, the aspect ratio of the gap of the embodiments in the disclosure is lowered, and the likelihood for voids to be formed during depositing the ILD into the gap is reduced. In other words, by tuning the shape of the spacer, a better gap-filling of the ILD can be achieved, and performance of the semiconductor device is improved.

In accordance with some embodiments of the disclosure, a semiconductor device includes a substrate, a gate structure over the substrate, a spacer and a source/drain region. The gate structure is disposed over the substrate. The spacer is disposed on a sidewall of the gate structure, wherein the spacer has a top surface lower than a top surface of the gate structure. The source/drain region is disposed adjacent to a sidewall of the spacer.

In accordance with alternative embodiments of the disclosure, a semiconductor device includes a substrate, a gate structure over the substrate, a single-layer spacer and a source/drain region. The gate structure is disposed over the substrate. The single-layer spacer is in physical contact with a sidewall of the gate structure, and a portion of the sidewall of the gate structure is not covered by the single-layer spacer. The source/drain region is disposed adjacent to the gate structure.

In accordance with yet alternative embodiments of the disclosure, a method of forming a semiconductor device includes the following steps. A substrate is provided. A gate structure is formed over the substrate. A spacer is formed adjacent to a sidewall of the gate structure. A source/drain region is formed aside the gate structure. The spacer is partially removed, so that the spacer has a top surface lower than a top surface of the gate structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a substrate;
   a gate structure over the substrate;
   a spacer on a sidewall of the gate structure, wherein the spacer has a top surface lower than a top surface of the gate structure; and
   a raised source/drain region protruding from the substrate, wherein the spacer has a top portion and a bottom portion integrally formed with the top portion, the bottom portion is disposed between and in physical contact with the gate structure and the raised source/drain region, and the top portion is protruded from the raised source/drain region.

2. The semiconductor device of claim 1, wherein the gate structure comprises a gate electrode, and the top surface of the spacer is lower than a top surface of the gate electrode.

3. The semiconductor device of claim 1, wherein the top portion of the spacer has a curved outer sidewall.

4. The semiconductor device of claim 1, wherein the top portion of the spacer has a tapered outer sidewall.

5. The semiconductor device of claim 1, wherein the top portion of the spacer has a first part with a substantially vertical outer sidewall and a second part with a tapered outer sidewall, and the second part is disposed between the first part and the bottom portion.

6. The semiconductor device of claim 5, wherein the first part has a substantially horizontal top surface physically connecting the substantially vertical outer sidewall of the first part.

7. The semiconductor device of claim 1, further comprising a dielectric layer covering the spacer, and an outer sidewall of the top portion of the spacer is in physical contact with the dielectric layer.

8. A semiconductor device, comprising:
a substrate;
a gate structure over the substrate;
a single-layer spacer on a sidewall of the gate structure, wherein a portion of the sidewall of the gate structure is not covered by the single-layer spacer; and
a raised source/drain region protruding from the substrate, wherein the single-layer spacer is in physical contact with the gate structure and the raised source/drain region.

9. The semiconductor device of claim 8 further comprising a contact etch stop layer (CESL) over the substrate, wherein the CESL is in physical contact with the portion of the sidewall of the gate structure and an outer sidewall of the single-layer spacer.

10. The semiconductor device of claim 9, wherein a top surface of the CESL is leveled with a top surface of the gate structure.

11. The semiconductor device of claim 8, wherein an outer sidewall of the single-layer spacer has a first endpoint on the sidewall of the gate structure and a second endpoint on the raised source/drain region.

12. The semiconductor device of claim 8, wherein the single-layer spacer has a curved outer sidewall.

13. A method of forming a semiconductor device, comprising:
providing a substrate;
forming a gate structure over the substrate;
forming a spacer adjacent to a sidewall of the gate structure;
forming a source/drain region aside the gate structure;
partially removing the spacer, to reduce a height of the spacer; and
after partially removing the spacer, sharping an outer sidewall of the spacer.

14. The method of claim 13, wherein an outer sidewall of the spacer is curved after partially removed.

15. The method of claim 13, wherein after sharping, the outer sidewall has a substantially vertical sidewall and a tapered sidewall.

16. The method of claim 13, wherein the gate structure comprises a gate electrode, and a top surface of the spacer is lower than a top surface of the gate electrode.

17. The method of claim 13, wherein a top of the spacer is substantially flush with a top of the gate structure.

18. The method of claim 13, wherein partially removing the spacer is performed after forming the source/drain region.

19. The method of claim 13, wherein the spacer has a top portion and a bottom portion integrally formed with the top portion, the bottom portion is disposed between and in physical contact with the gate structure and the source/drain region, and the top portion is protruded from the source/drain region.

20. The method of claim 13, wherein after sharping, the outer sidewall is tapered.

* * * * *